US 6,781,289 B2

United States Patent
Heinz et al.

(10) Patent No.: US 6,781,289 B2
(45) Date of Patent: Aug. 24, 2004

(54) PIEZO ACTUATOR

(75) Inventors: Rudolf Heinz, Renningen (DE); Alexander Hedrich, Stuttgart (DE); Friedrich Boecking, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/296,331

(22) PCT Filed: Apr. 5, 2001

(86) PCT No.: PCT/DE01/01329
§ 371 (c)(1),
(2), (4) Date: May 9, 2003

(87) PCT Pub. No.: WO01/91197
PCT Pub. Date: Nov. 29, 2001

(65) Prior Publication Data
US 2003/0168937 A1 Sep. 11, 2003

(30) Foreign Application Priority Data
May 25, 2000 (DE) .......................... 100 25 997

(51) Int. Cl.⁷ ...................... H01L 41/053; H01L 41/083
(52) U.S. Cl. ..................... 310/346; 310/328; 310/348
(58) Field of Search .............................. 310/328, 346, 310/348

(56) References Cited
U.S. PATENT DOCUMENTS 3,349,259 A * 10/1967 Kistler ........................ 310/338
3,598,506 A * 8/1971 O'Neill ........................ 417/383
4,553,059 A * 11/1985 Abe et al. .................... 310/328
6,333,587 B1 * 12/2001 Heinz et al. ................. 310/328
6,371,085 B1 * 4/2002 Boecking .................... 123/498
6,424,078 B1 * 7/2002 Heinz .......................... 310/328
6,552,472 B1 * 4/2003 Heinz .......................... 310/328
6,552,473 B2 * 4/2003 Montuschi et al. ......... 310/328
2003/0008536 A1 * 1/2003 Whelan ....................... 439/86

FOREIGN PATENT DOCUMENTS

| DE | 38 44 134 A | 7/1989 | .......... F02M/51/06 |
| DE | 199 14 411 A | 10/2000 | .......... H02N/2/04 |
| WO | WO 92 06532 A | 4/1992 | .......... H02N/2/00 |

* cited by examiner

Primary Examiner—Thomas M. Dougherty
(74) Attorney, Agent, or Firm—Ronald E. Greigg

(57) ABSTRACT

A piezoelectric actuator in which a piezoelectric element is present for subjecting an actuating element to a tensile or compressive stress. A sleeve is secured to a foot part, to which the piezoelectric element is secured and by way of which the piezoelectric element is kept centered in a housing under mechanical prestressing, and this sleeve surrounds the piezoelectric element in such a way as to stabilize it mechanically, at least in partial regions that are electrically insulated from the piezoelectric element. Between the sleeve and the piezoelectric element, a heat-conducting elastomer is placed, and the sleeve comprises a heat-conducting material that is deformable within predetermined limits.

20 Claims, 2 Drawing Sheets

PIEZO ACTUATOR

CROSS-REFERENCE TO RELATED APPLICATIONS

This application is a 35 USC 371 application of PCT/DE 01/01329 filed on Apr. 5, 2001.

BACKGROUND OF THE INVENTION

1. Field of the Invention

The invention relates to an improved piezoelectric actuator for actuating a mechanical component such as a valve or the like.

2. Description of the Prior Art

It is generally known that by using the so-called piezoelectric effect, a piezoelectric element can be constructed from a material having a suitable crystalline structure. When an external electrical voltage is applied, a mechanical reaction of the piezoelectric element ensues, which as a function of the crystalline structure and the regions of contact with the electrical voltage exerts a pressure or tension in a predeterminable direction.

From German Patent Disclosure DE 196 50 900, for instance, a piezoelectric actuator is known which is suitable particularly for actuating control valves or injection valves in motor vehicles. To that end, it comprises layers, stacked on one another in the manner of a laminate, of piezoelectric material with metal or electrically conductive layers serving as electrodes located between them. The actuator body thus formed, on each of whose end faces a respective head plate toward the valve, with an axially protruding valve tappet, and an opposed foot plate are attached, is inserted into a retaining bore of a valve housing. On the face end, the actuator body is prestressed in the axial direction, between the head plate and the foot plate, by a spring element.

As mentioned at the outset, such piezoelectric multilayer actuators, when they are subjected to a pulsating electrical voltage on their electrode layers, execute similarly pulsating strokes, changing the spacing between their two face ends. The piezoelectric multilayer actuator must be supported in the steel housing of the injection valve in such a way that short circuits cannot occur, which means that a centered installation with a defined spacing from the outer wall must be assured, and there must be no risk of short circuits between the actuator body and the outer wall.

In operation of such piezoelectric multilayer actuators, heat occurs in the actuator body, and if destruction and impairment of the function of the multilayer actuator is to be avoided, this heat must be dissipated to the outside, or in this case to the valve housing of the injection valve or control valve. In the known multilayer actuator mentioned above, the spring sleeve absorbs the heat generated by the actuator body and carries it to the outside and simultaneously assures the centering, required for installation, of the actuator body in the valve housing. It is intrinsically known from German Patent DE 197 15 488 C1 that an actuator body be surrounded with a polymer envelope, but this envelope leaves an air gap open between itself and the inner wall of the valve housing. The result is the disadvantage that the dissipation of heat through the air gap to the valve housing is made more difficult.

SUMMARY OF THE INVENTION

In the piezoelectric actuator of the invention, it is assumed that there is a piezoelectric element which is suitable for subjecting an actuating element to a tensile or compressive stress and which is provided with a foot part to which the piezoelectric element is secured and by way of which the piezoelectric element is kept centered in a housing with mechanical prestressing. Advantageously, a sleeve is secured to the foot part and surrounds the piezoelectric element in such as way as to stabilize it mechanically, at least in partial regions that are electrically insulated from the piezoelectric element.

It is especially advantageous if a heat-conducting elastomer is placed between the sleeve and the piezoelectric element, and the sleeve comprises a heat-conducting material that is deformable within predetermined limits. This component group containing the piezoelectric element and the sleeve on the foot part can be press-fitted in a simple way into a retaining bore of the housing, resulting in good thermal conduction from the piezoelectric multilayer actuator, for instance to a valve housing. The foot part can also have an encompassing groove, into which a likewise encompassing groove can be latched on the inside diameter of the sleeve.

With the sleeve, the piezoelectric actuator has a surface that is not vulnerable, for instance to chemical factors, and it can be installed simply, and an actuator module of this kind is also protected against harmful impairments during shipping and in assembly. The piezoelectric actuator cast in the sleeve is both centered and secured against rotation by the elastomer, since the flow of force is not only via the foot part but additionally via the elastomer to the sleeve that is also joined to the foot part.

Compared to a piezoelectric actuator without a sleeve and sheathed with only a heat-conducting elastomer, the production process is also more economical, since the requisite care taken of the casting molds is unnecessary. Assembling the piezoelectric actuator of the invention is also simpler, because injuries to the sheathing and the attendant output of heat-conductive particles, with consequent soiling of the retaining bore, cannot occur, as they can in a piezoelectric actuator that is sheathed only with elastomer.

The sheath of the invention, which is as a rule thin-walled and which comprises the heat-conducting and deformable material, such as copper, steel or a plastic, is solidly joined to the foot part of the piezoelectric element, and to improve the centering, it can have a slightly increasing outer diameter toward the top. A metal sleeve, for instance, can be produced economically in the form of a rolled component of stamped sheet metal. A plastic sleeve, for instance in the form of an injection-molded part, is then allowed to touch the piezoelectric element and can thus lend the actuator module greater stability even without elastomer sheathing.

In a further embodiment, it is advantageous if by means of centering rings additionally placed in the sleeve and preferably having a hollow profile, the piezoelectric element can be centered even better in the sleeve, while at the same time space is created for the compensation of thermal and press-fitting expansion.

By means of an oblique shoulder in the retaining bore, a calibrating press-fitting of the sleeve can also be made possible in a simple way, thus assuring a close contact of the sleeve with the retaining bore, as a result of which very good heat conduction radially outward takes place.

In another embodiment of the piezoelectric actuator of the invention, the sleeve is perforated or slotted, so that the heat-conducting elastomer can flow through this sleeve and directly produces the heat conduction between the piezoelectric element and the housing having the retaining bore. The casting of the piezoelectric element can be done either in the housing or in a re-usable or lost-type mold.

These and other characteristics of preferred refinements of the invention can be learned from the description and the drawings; the individual characteristics may each individually or in the form of subcombinations with each other be realized in the embodiment of the invention and in other fields and can represent both advantageous and intrinsically patentable embodiments for which patent protection is here claimed.

BRIEF DESCRIPTION OF THE DRAWINGS

Exemplary embodiments of the piezoelectric actuator of the invention, for example for a fuel injection system in a motor vehicle, will now be explained in conjunction with the drawings, in which.

DESCRIPTION OF THE PREFERRED EMBODIMENTS

Figure 1:
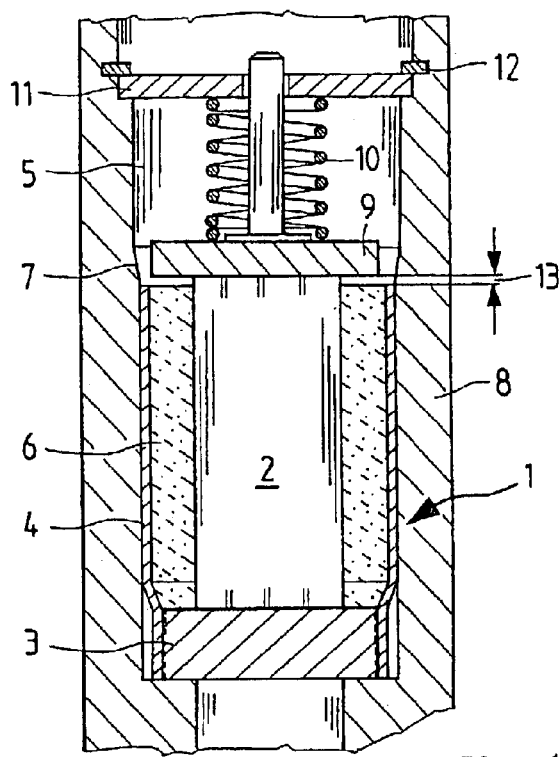
FIG. 1 is a section through a piezoelectric actuator, with a sleeve and an elastomer layer.

In FIG. 1, a piezoelectric actuator 1 is shown in the form of a piezoelectric multilayer actuator, which has a piezoelectric element 2 that in a manner known per se is constructed from piezoelectric sheets of a quartz material with a suitable crystalline structure, so that by using the so-called piezoelectric effect, when an external electrical voltage is applied to electrodes, not shown here, a mechanical reaction of the piezoelectric actuator 1 ensues, in the form of an axial motion.

On its fixed end, the piezoelectric actuator 1 is centered and solidly joined to a foot part 3 of steel or ceramic. On the foot part 3, a deformable and highly heat-conductive sleeve is put in place and joined to the foot part 3, for instance by welding. The sleeve 4 has a lesser diameter in the region of the foot part 3, since the sleeve 4, in the process of being press-fitted into a retaining bore 5, is unable to yield radially in this region because of the foot part 3. The sleeve 4 is made for instance of copper, steel or a plastic, and it can be either as long as the entire piezoelectric element 2 or can be shorter, so as to reinforce only the connection between the piezoelectric element 2 and the foot part 3.

The piezoelectric element 2 is cast in the sleeve 4 with a heat-conducting elastomer 6. Via a taper 7 in the retaining bore 5, for instance in a valve housing 8, this component combination is press-fitted into the retaining bore 5; the sleeve 4 has only a slight oversize compared to the retaining bore 5 in the valve housing 8, so that production tolerances in the housing 8 and the sleeve 4 can be compensated for, and so that good heat conduction is established between the housing 8 and the sleeve 4.

Located on the moving end of the piezoelectric actuator is a head part with a thrust bolt 9, which is either solidly joined to the piezoelectric element 2 or merely rests on it and which braces the piezoelectric actuator 1 via a spring 10 in such a way that the piezoelectric actuator is subjected during operation only to compressive stresses. The nonpositive engagement, or flow of force, extends here via a fixation shim 11 and a securing ring 12 into the valve housing 8 and back into the piezoelectric element 2 again via the foot part 3.

Between the elastomer 6 and the sleeve 4, on one side, and the head part 9 on the other, a gap 13 is formed, which serves to compensate for thermal expansion and deformation in the press-fitting operation. The centering of the piezoelectric actuator 1 is then effected via the sleeve 4, and not via the foot part 3.

Figure 2:
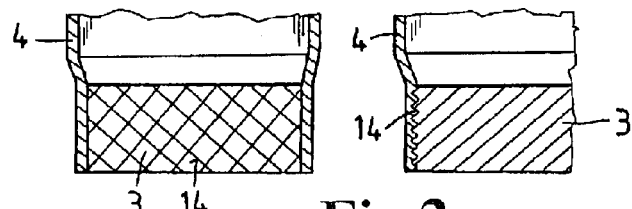
FIGS. 2–5 are sectional views of the foot part with different possibilities for securing the foot part to the piezoelectric element.
Figure 3:
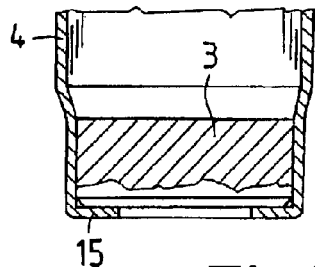
Figure 4:
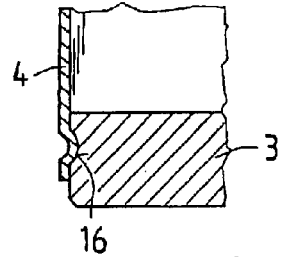

The sleeve 4 can be secured to the foot part 3, for instance being soldered, welded, or glued, or secured by the methods described below in conjunction with FIGS. 2–4. In FIG. 2, gnurling 14 is applied to the circumference of the foot part 3, and the sleeve 4 is press-fitted onto the gnurling with positive engagement. In the exemplary embodiment of FIG. 3, the sleeve 4 is shown as a deep-drawn part, with a cap 15 on which the foot part 3 is mounted. In this case, the flow of force travels during operation from the piezoelectric element 2 via the cap 15 of the sleeve 4 into the valve housing 8. As a further variant form of securing, FIG. 4 shows an encompassing groove 16 in the foot part 3, into which the sleeve 4 is crimped.

Figure 5:
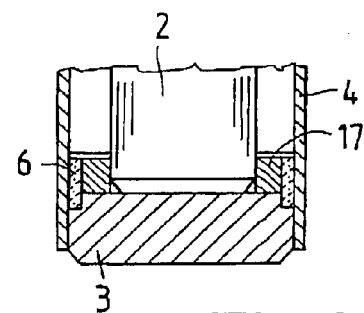

In an exemplary embodiment of FIG. 5, the piezoelectric element 2 is provided with a centering ring 17, which rests on the foot part 3. The centering ring 17 is embodied in such a way that it traps an air volume and can be compressed by the elastomer 6 upon thermal expansion of the elastomer.

Figure 6:
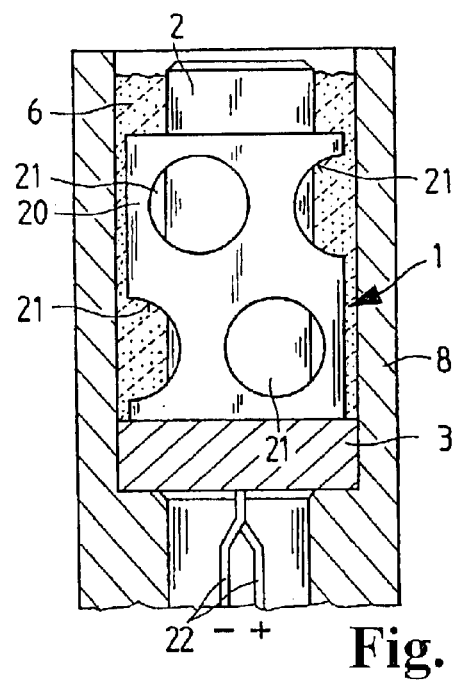
FIG. 6, a section through a piezoelectric actuator with a sleeve having recesses in the form of holes.
Figure 7:
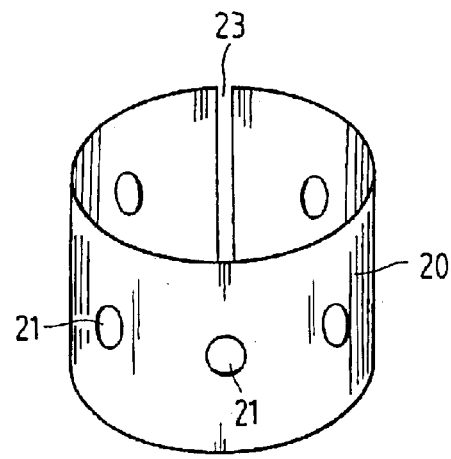
FIG. 7, a detail of the sleeve of FIG. 6.

In FIG. 6, an exemplary embodiment of the piezoelectric actuator 1 is shown which has a sleeve 20 with recesses, in this case holes 21 or additional vertical slots. The electrical terminals 22 for the piezoelectric element 2 protrude from the bottom side of the foot part 3 and are passed through the foot part 3. Once again, the piezoelectric element 2, sleeve 20 and foot part 3 are mounted in the housing 8 and are surrounded by a heat-conducting elastomer 6, which either surrounds these components in a casting mold before assembly or is not cast into the housing 8 until in the assembled state. This elastomer 6 serves to dissipate the lost energy, converted into heat, from the piezoelectric element 2 during operation to the housing 8. FIG. 7 shows a modified form of the sleeve 20 with a vertical slot 23.

Figure 8:
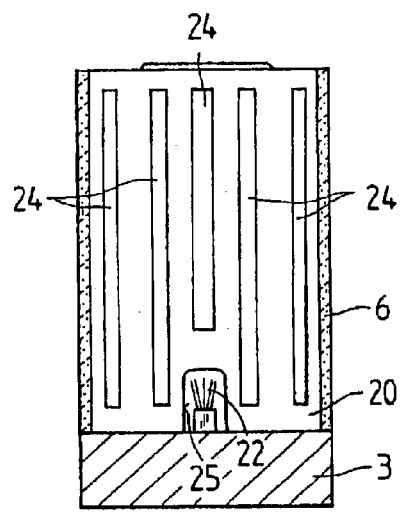
FIG. 8, a section through a piezoelectric actuator with a sleeve with recesses in the form of oblong slots.

In FIG. 8, a variant of the embodiment of the sleeve 20 with oblong slots 24 can be seen. Here there is also a recess 25 for the electrical terminals 22 of the piezoelectric element 2.

Figure 9:
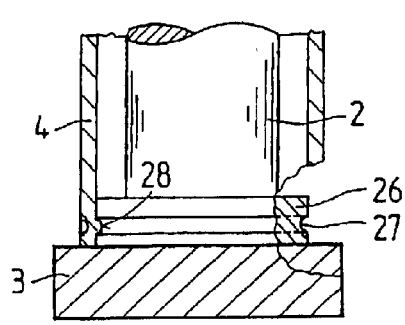
FIG. 9, a detail of the foot part, with a further possibility of securing it to the piezoelectric element.

In the exemplary embodiment of FIG. 9, a further possible connection of the foot part 3 to the sleeve 4 or 20 is shown. The piezoelectric element 2 is placed in centered fashion on the foot part 3, and in the foot part 3, in a shoulder 26 serving to receive the sleeve 4 or 20, a groove 27 is made into which an encompassing bead 28 is latched in on the inside diameter of the sleeve 4 or 20 and thus joins the two components to one another.

The foregoing relates to preferred exemplary embodiment of the invention, it being understood that other variants and embodiments thereof are possible within the spirit and scope of the invention, the latter being defined by the appended claims.

What is claimed is:

1. A piezoelectric actuator, comprising at least one piezoelectric element for subjecting an actuating element to a tensile or compressive stress, said piezoelectric element having a moving end and a fixed end opposite the moving end, a foot part (3) to which the fixed end of the piezoelectric element (2) is secured and by way of which the piezoelectric element (2) is kept centered in a housing (8) under a mechanical prestressing, a sleeve (4, 20) secured to the foot part (3) and surrounding the piezoelectric element (2) In such a way as to stabilize the sleeve (4, 20) mechanically, at least in regions that are electrically insulated from the piezoelectric element, the housing (8) having a retaining bore (5) for receiving the piezoelectric actuator and into which the sleeve (4, 20) together with the piezoelectric element (2) are firmly press-fitted optionally via an oblique shoulder (7) on the periphery of the retaining bore (5).

2. The piezoelectric actuator of claim 1, further comprising a heat-conducting elastomer (6) placed between the sleeve (4, 20) and the piezoelectric element (2).

3. The piezoelectric actuator of claim 1, wherein the sleeve (4, 20) comprises a heat-conducting material that is deformable within predetermined limits.

4. The piezoelectric actuator of claim 2, wherein the sleeve (4, 20) comprises a heat-conducting material that is deformable within predetermined limits.

5. The piezoelectric actuator of claim 3, wherein the sleeve (4, 20) is of metal.

6. The piezoelectric actuator of claim 4, wherein the sleeve (4, 20) is of metal.

7. The piezoelectric actuator of claim 3, wherein the sleeve (4, 20) is of plastic.

8. The piezoelectric actuator of claim 4, wherein the sleeve (4, 20) is of plastic.

9. The piezoelectric actuator of claim 1, wherein the sleeve (20) has recesses (21, 23, 24, 25) in its wall.

10. The piezoelectric actuator of claim 2, wherein the sleeve (20) has recesses (21, 23, 24, 25) in its wall.

11. The piezoelectric actuator of claim 3, wherein the sleeve (20) has recesses (21, 23, 24, 25) in its wall.

12. The piezoelectric actuator of claim 5, wherein the sleeve (20) has recesses (21, 23, 24, 25) in its wall.

13. The piezoelectric actuator of claim 7, wherein the sleeve (20) has recesses (21, 23, 24, 25) in its wall.

14. The piezoelectric actuator of claim 1, wherein the foot part (3) has an encompassing groove (27), into which a likewise encompassing bead (28) can be latched on the inside diameter of the sleeve (4, 20).

15. The piezoelectric actuator of claim 2, wherein the foot part (3) has an encompassing groove (27), into which a likewise encompassing bead (28) can be latched on the inside diameter of the sleeve (4, 20).

16. The piezoelectric actuator of claim 5, wherein the foot part (3) has an encompassing groove (27), into which a likewise encompassing bead (28) can be latched on the inside diameter of the sleeve (4, 20).

17. The piezoelectric actuator of claim 1, further comprising a centering ring (17) between the piezoelectric element (2) and the sleeve (4, 20).

18. The piezoelectric actuator of claim 2, further comprising a centering ring (17) between the piezoelectric element (2) and the sleeve (4, 20).

19. The piezoelectric actuator of claim 9, wherein, after the piezoelectric element (2) with the sleeve (20) has been inserted into a retaining bore (5) in the housing (8) for the piezoelectric actuator (1), the remaining interstices in the retaining bore (5) are filled at least partially with a heat-conducting elastomer (6).

20. The piezoelectric actuator of claim 14, wherein, after the piezoelectric element (2) with the sleeve (20) has been inserted into a retaining bore (5) in the housing (8) for the piezoelectric actuator (1), the remaining interstices in the retaining bore (5) are filled at least partially with a heat-conducting elastomer (6).

* * * * *

UNITED STATES PATENT AND TRADEMARK OFFICE
CERTIFICATE OF CORRECTION

PATENT NO. : 6,781,289 B2
DATED : August 24, 2004
INVENTOR(S) : Rudolf Heinz et al.

It is certified that error appears in the above-identified patent and that said Letters Patent is hereby corrected as shown below:

<u>Title page,</u>
Item [54], Title, please correct to read as follows:
-- PIEZOELECTRIC ACTUATOR --

Signed and Sealed this

Eighth Day of February, 2005

JON W. DUDAS
*Director of the United States Patent and Trademark Office*